United States Patent
Lee et al.

(10) Patent No.: US 10,116,281 B2
(45) Date of Patent: Oct. 30, 2018

(54) POWER COMBINER/DIVIDER USING MUTUAL INDUCTANCE

(71) Applicants: Samsung Electronics Co., Ltd., Gyeonggi-do (KR); Foundation of Research & Business, Chungnam National University, Daejeon (KR)

(72) Inventors: Jeong-Ho Lee, Gyeonggi-do (KR); Choul-Young Kim, Daejeon (KR); Hyun-Myung Oh, Daejeon (KR); Chul-Woo Byeon, Gyeonggi-do (KR); Ju-Ho Son, Seoul (KR)

(73) Assignees: Samsung Electronics Co., Ltd (KR); Foundation of Research & Business, Chungnam National University (KR)

( * ) Notice: Subject to any disclaimer, the term of this patent is extended or adjusted under 35 U.S.C. 154(b) by 14 days.

(21) Appl. No.: 15/371,792

(22) Filed: Dec. 7, 2016

(65) Prior Publication Data

US 2017/0163237 A1 Jun. 8, 2017

(30) Foreign Application Priority Data

Dec. 7, 2015 (KR) ........................ 10-2015-0173141

(51) Int. Cl.
*H01P 5/12* (2006.01)
*H03H 7/46* (2006.01)
*H03H 7/38* (2006.01)

(52) U.S. Cl.
CPC ................ *H03H 7/46* (2013.01); *H03H 7/38* (2013.01)

(58) Field of Classification Search
CPC ............ H03H 7/46; H03H 7/48; H03H 7/463; H03H 7/42; H03H 7/422; H04N 7/104; H01P 5/18
See application file for complete search history.

(56) References Cited

U.S. PATENT DOCUMENTS

| 8,130,057 B2 | 3/2012 | Jones et al. | |
| 2010/0244981 A1* | 9/2010 | Gorbachov | H03H 7/48 333/124 |

FOREIGN PATENT DOCUMENTS

JP 3625753 3/2005

* cited by examiner

*Primary Examiner* — Robert J Pascal
*Assistant Examiner* — Kimberly Glenn
(74) *Attorney, Agent, or Firm* — The Farrell Law Firm, P.C.

(57) ABSTRACT

Disclosed is a power divider circuit providing a mutual inductance and including a first primary inducing element having a first terminal connected with a first output port and a second terminal connected with a second primary inducing element having a first terminal connected with a second output port and a second terminal connected with the first primary inducing element and magnetically and mutually coupled with the first primary inducing element, a sub inducing element having a first terminal connected with an input port and a second terminal connected with the second terminal of the first primary inducing element and the second terminal of the second primary inducing element, and an isolation network connected between the first output port and the second output port. The sub inducing element is magnetically and mutually coupled with each of the first primary inducing element and the second primary inducing element.

10 Claims, 9 Drawing Sheets

POWER COMBINER/DIVIDER USING MUTUAL INDUCTANCE

PRIORITY

This application claims priority under 35 U.S.C. § 119(a) to a Korean Patent Application filed in the Korean Intellectual Property Office on Dec. 7, 2015 and assigned Serial No. 10-2015-0173141, the contents of which are incorporated herein by reference.

BACKGROUND

1. Field of the Disclosure

The present disclosure relates generally to power combiners/dividers, and more particularly, to power combiners/dividers that use mutual inductance.

2. Description of the Related Art

Current fourth generation partnership project (4G) long term evolution (LTE) systems enable high-rate data communications up to at least 100 Mbps. However, there is increasing demand for high-rate data transmission using wireless communication.

One method for meeting this demand is to use millimeter wave band frequencies. The use of a 28 GHz and 60 GHz band frequency allows for use of a bandwidth of at least 800 MHz. The use of a broad band enables communication at a 1 Gbps or higher data rate even when a simple modulation scheme is used. However, millimeter wave band signals tend to be straight, and thus are difficult to use in non-line-of-sight (NLOS) environments.

However, beamforming technology is used to address this issue. In other words, 4G LTE systems enable transmission/reception of signals in various directions by coupling together multiple transceivers using the beamforming technology, by implementing a power combiner/divider. The power combiner/divider commonly occupies a large area, disadvantageously increasing the size of a chip for implementing an overall beamforming circuit. When the power combiner/divider itself causes a larger power loss or is designed to negate such power loss, the power combiner/divider enlarges, causing an inconvience in size.

As such, there is a need in the art for a high performance power combiner/divider that does not incur a size increase.

SUMMARY

An aspect of the present disclosure is to address at least the above-mentioned problems and/or disadvantages and to provide at least the advantages described below.

Another aspect of the present disclosure is to provide small-sized power combiners/dividers with minimal power loss.

Another aspect of the present disclosure is to provide compact power combiners/dividers with the same performance as Wilkinson power combiners/dividers.

According to an aspect of the present disclosure, a power divider circuit using a mutual inductance includes a first primary inducing element having a first terminal connected with a first output port and a second terminal connected with a second primary inducing element, the second primary inducing element having a first terminal connected with a second output port and a second terminal connected with the first primary inducing element and magnetically and mutually coupled with the first primary inducing element, a first sub inducing element having a first terminal connected with an input port and a second terminal connected with the second terminal of the first primary inducing element and the second terminal of the second primary inducing element, and an isolation network connected between the first output port and the second output port, wherein the first sub inducing element is magnetically and mutually coupled with each of the first primary inducing element and the second primary inducing element.

BRIEF DESCRIPTION OF THE DRAWINGS

The above and other aspects, features, and advantages of certain embodiments of the present disclosure will be more apparent from the following detailed description taken in conjunction with the accompanying drawings, in which.

Throughout the drawings, like reference numerals will be understood to refer to like parts, components, and structures.

DETAILED DESCRIPTION OF EMBODIMENTS OF THE DISCLOSURE

Hereinafter, embodiments of the present disclosure are described in detail with reference to the accompanying drawings. The detailed description of known functions and/or configurations will be omitted for the sake of clarity and conciseness. The terms as used herein are defined considering the functions in the present disclosure and may be replaced with other terms according to the intention or practice of the user or operator. Therefore, the terms should be defined based on the overall disclosure.

Although inductors are described as inductive elements in this disclosure, transmission lines or inductors may be included as elements having an inductance.

A conventional Wilkinson power combiner/divider that is widely used in wireless communication devices will now be described. The Wilkinson power combiner/divider is a passive microwave element having a phase difference of 0 degrees between two output ports and is primarily used to evenly distribute power. The Wilkinson power combiner/divider may be used to combine/divide orthogonal radio frequency (RF) signals into one transmission signal and transmit/receive the signal through an antenna, and is used to obtain a mutual inductance. Implementation requires a predetermined space to obtain a higher inductance.

Figure 1:
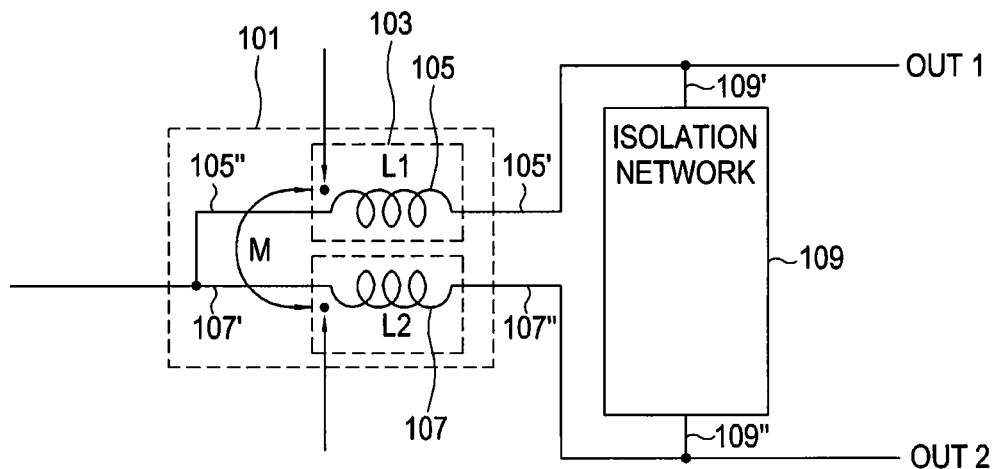
FIG. 1 illustrates a conventional structure of a Wilkinson power combiner/divider.

FIG. 1 illustrates a structure of a Wilkinson power combiner/divider.

The Wilkinson power combiner/divider may include a pair of inductors 101 and an isolation network 109.

The pair of inductors 101 includes a first primary inductor 105 and a second primary inductor 107. It is assumed here that the inductance of the first primary inductor 105 is L1 (unit: H), and the inductance of the second primary inductor 107 is L2 (unit: H). The first primary inductor 105 and the second primary inductor 107 are magnetically coupled together, and it is assumed that a mutual inductance therebetween is M (unit: H).

A first terminal 105' of the first primary inductor 105 may be connected with a first output port, and a second terminal 105" of the first primary inductor 105 may be connected with a first terminal 107' of the second primary inductor 107 and an input port. The first terminal 107' of the second primary inductor 107 may be connected with the second terminal 105" of the first primary inductor 105 and the input port, and a second terminal 107" of the second primary inductor 107 may be connected with a second output port. A first terminal 109' of the isolation network 109 may be connected with the first output port, and a second terminal 109" of the isolation network 109 may be connected with the second output port.

The pair of inductors 105 and 107 may generally be more simply implemented as a transmission line and a resistor, in such a manner as to adjust the length of the transmission line rather than using actual inductor electronic elements. The length of the transmission line is λ/4, where λ is the wavelength.

In order to reduce the size of the Wilkinson power combiner/divider, the pair of inductors may be implemented as electronic elements. The use of the mutual inductance between the pair of inductors may further reduce the size of the Wilkinson power combiner/divider.

However, it is difficult to implement a pair of inductors symmetrically arranged in a small space.

Figure 2A:
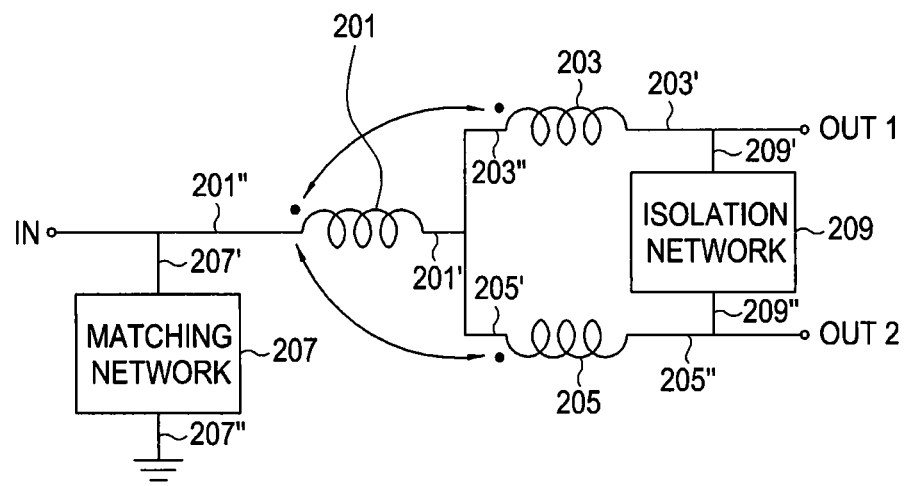
FIGS. 2A, 2B and 2C illustrate a structure of a Wilkinson power combiner/divider according to the present disclosure.
Figure 2B:
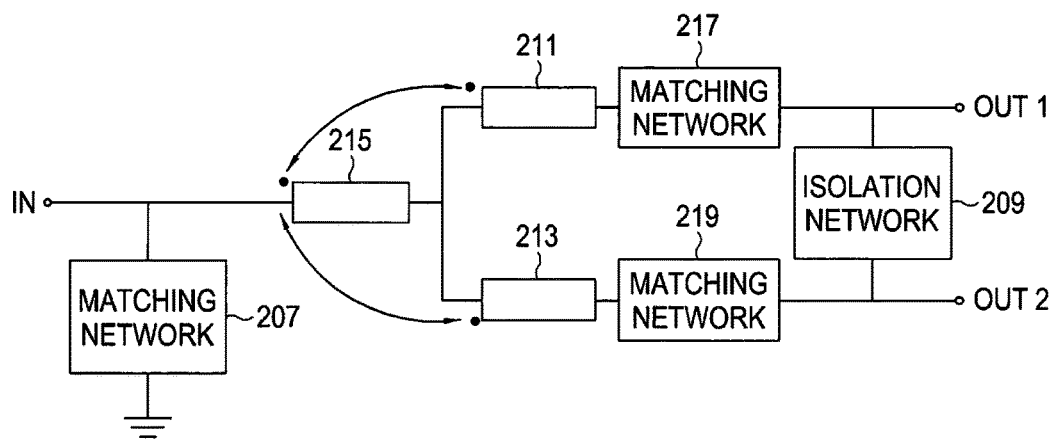
Figure 2C:
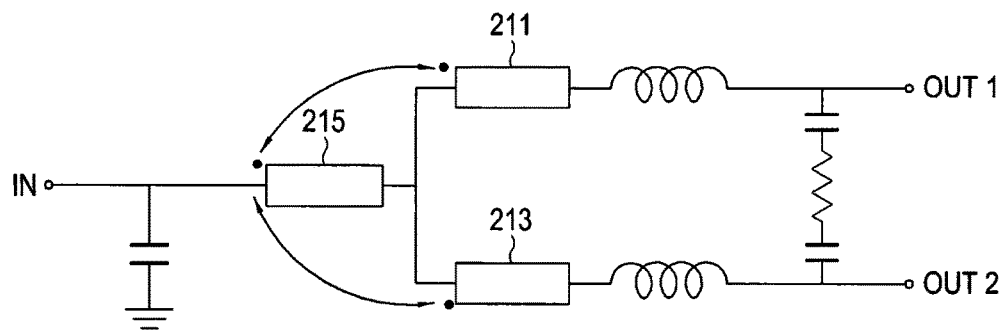

FIGS. 2A, 2B and 2C illustrate a structure of a Wilkinson power combiner/divider according to the present disclosure.

Referring to FIGS. 2A, 2B and 2C, a Wilkinson power combiner/divider includes a sub inductor 201 in its planar structure, symmetrically influencing the pair of primary inductors while providing a mutual inductance to the two primary inductors 203 and 205. Accordingly, the size of the two primary inductors 203 and 205 to obtain a predetermined inductance may be reduced.

The symmetrical influence by the sub inductor 201 may increase the isolation between the output ports in the Wilkinson power combiner/divider. The reduction in size of the two primary inductors 203 and 205 leads to a decrease in the line resistance and, in turn, a decrease in power loss of the Wilkinson power combiner/divider. According to the present disclosure, the Wilkinson power combiner/divider may enhance the balance performance between output ports.

According to the present disclosure, the Wilkinson power combiner/divider may include a sub inductor 201 and a pair of primary inductors 203 and 205. The Wilkinson power combiner/divider may further include at least one of a matching network 207 and an isolation network 209.

The matching network 207 is for an impedance matching in the input port.

The sub inductor 201 is magnetically and mutually coupled with each of the pair of primary inductors 203 and 205.

Referring to FIG. 2A, a first terminal 203' of the first primary inductor 203 may be connected with a first output port and a first terminal 209' of the isolation network 209, and a second terminal 203" of the first primary inductor 203 may be connected with a first terminal 205' of the second primary inductor 205 and a first terminal 201' of the sub inductor 201. The first terminal 205' of the second primary inductor 205 may be connected with a second terminal 203" of the first primary inductor 203 and the first terminal 201' of the sub inductor 201, and a second terminal 205" of the second primary inductor 205 may be connected with a second output port and a second terminal 209" of the isolation network 209. The first terminal 209' of the isolation network 209 may be connected with the first terminal 203' of the first primary inductor 203, and the second terminal 209" of the isolation network 209 may be connected with the second terminal 205" of the second primary inductor 205. The first terminal 201' of the sub inductor 201 may be connected with the second terminal 203" of the first primary inductor 203 and the first terminal 205' of the second primary inductor 205, and the second terminal 201" of the sub inductor 201 may be connected with the input port and a first terminal 207' of the matching network 207. The first terminal 207' of the matching network 207 may be connected with the input port and the second terminal 201" of the sub inductor 201, and a second terminal 207" of the matching network 207 may be connected to ground.

FIG. 2B illustrates a Wilkinson power combiner/divider including a first transmission line 211, a second transmission line 213, and a sub transmission line 215, instead of the first primary inductor 203, the second primary inductor 205, and the sub inductor 201 shown in FIG. 2A, and further including a matching network 217 between the first transmission line 217 and a first output port and another matching network 219 between the second transmission line 213 and a second output port.

FIG. 2C illustrates a Wilkinson power combiner/divider in which the matching network is configured as a capacitor or inductor, and the isolation network is configured of a capacitor and a resistor, for example.

According to the present disclosure, even/odd analysis is used to analyze the Wilkinson power combiner/divider.

The even/odd analysis is a circuit analyzing method for a line path where a coupling occurs. For example, when alternating current (AC) flows through two line paths, it cannot be known whether the AC flows in the same or different directions. Thus, mathematical circuit analysis performed under the assumption that the AC flows the same through the two line paths is an even mode analysis method, and mathematical circuit analysis performed under the assumption that the AC flows through the two line paths in different directions is an odd mode analysis method.

Figure 3:
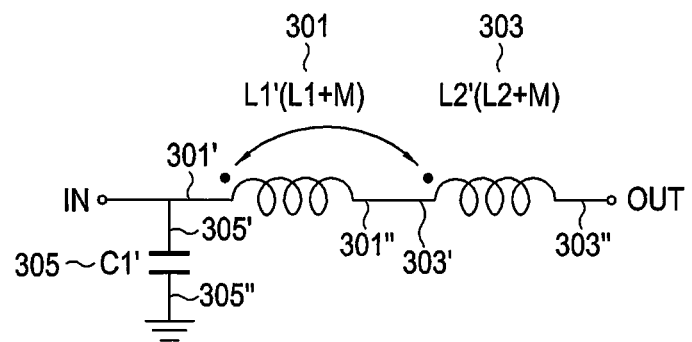
FIG. 3 illustrates an equivalent circuit of a Wilkinson power combiner/divider in an even mode according to the present disclosure.

FIG. 3 illustrates an equivalent circuit of a Wilkinson power combiner/divider in an even mode according to the present disclosure.

In the even mode, the equivalent circuit of the Wilkinson power combiner/divider according to the present disclosure may be represented as having a capacitor 305 and two inductors 301 and 303.

A first terminal 305' of the capacitor 305 may be connected with an input port and a first terminal 301' of one 301 of the two inductors, and a second terminal 305" of the capacitor 305 may be connected to ground. The first terminal 301' of the inductor 301 of the two inductors may be connected with the input port and the first terminal 305' of the capacitor 305, and a second terminal 301" of the inductor 301 of the two inductors may be connected with a first terminal 303' of the other inductor 303 of the two inductors. The first terminal 303' of the other inductor 303 of the two inductors may be connected with the second terminal 301" of the inductor 301 of the two inductors, and the second terminal 303" of the other inductor 303 of the two inductors may be connected with an output port.

The two inductors 301 and 303 correspond to one primary inductor 205 of the pair of inductors and the sub inductor 201. It is assumed that the inductance of the primary inductor 205 is L2, and the inductance of the sub inductor 201 is L1. The primary inductor 205 and the sub inductor 201 are magnetically and mutually coupled, where the mutual inductance is assumed to be M. Given the mutual inductance, the inductance of the one primary inductor is L1'(L1+M), and the inductance of the sub inductor 201 is L2'(L2+M). It can be shown that the inductance of the primary inductor and sub inductor has been increased due to the mutual inductance. That is, the mutual inductance may provide such an effect as if an inductor with a smaller inductance is an inductor with a larger inductance.

The capacitor 305 is an electronic element added for impedance matching. The value of the capacitor may be obtained using Equations (1) and (2) as follows.

$$L1' + L2' = \frac{Z_{Out}}{\omega_0} \sqrt{\frac{nZ_{In} - Z_{Out}}{Z_{Out}}} \quad (1)$$

$$C1' = \frac{1}{nZ_{In}\omega_0} \sqrt{\frac{nZ_{In} - Z_{Out}}{Z_{Out}}} \quad (2)$$

where $Z_{in}$ is the input impedance, $Z_{Out}$ is the output impedance, and $\omega_0$ is the center frequency.

Figure 4:
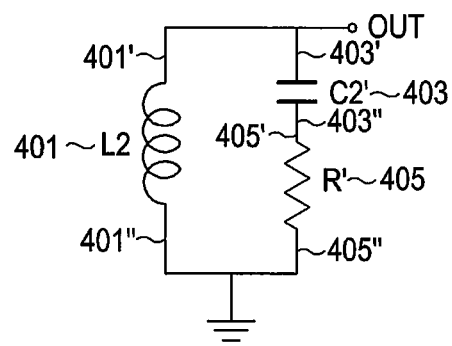
FIG. 4 illustrates an equivalent circuit of a Wilkinson power combiner/divider in an odd mode according to the present disclosure.

FIG. 4 illustrates an equivalent circuit of a Wilkinson power combiner/divider in an odd mode according to the present disclosure.

In FIG. 4, the equivalent circuit of the Wilkinson power combiner/divider in the odd mode may be represented as having an inductor 401, a capacitor 403, and a resistor 405.

Specifically, a first terminal 401' of the inductor 401 may be connected with an output port and a first terminal 403' of the capacitor 403, and a second terminal 401" of the inductor 401 may be connected to ground. The first terminal 403' of the capacitor 403 may be connected with the output port and the first terminal 401' of the inductor 401, and a second terminal 403" of the capacitor 403 may be connected with a first terminal 405' of the resistor 405. The first terminal 405' of the resistor 405 may be connected with a second terminal 403" of the capacitor 403, and a second terminal 405" of the resistor 405 may be connected to ground.

It is assumed that the inductor 401 corresponds to the second primary inductor of FIG. 2 and the inductance of the second primary inductor is L2. Similar to the even mode, the capacitor 403 and the resistor 405 are added for an impedance matching. The values of the capacitor 403 and the resistor 405 may be obtained using Equations (3) and (4) as follows.

$$R' = \frac{\omega_0^2 L_2^2 Z_{Out}}{\omega_0^2 L_2^2 + Z_{Out}^2} \quad (3)$$

$$C2' = \frac{\omega_0^2 L_2^3 + Z_{Out}^2 L_2}{\omega_0^2 L_2^2 Z_{Out}^2} \quad (4)$$

where $Z_{in}$ is the input impedance, $Z_{Out}$ is the output impedance, and $\omega_0$ is the center frequency.

Figure 5:
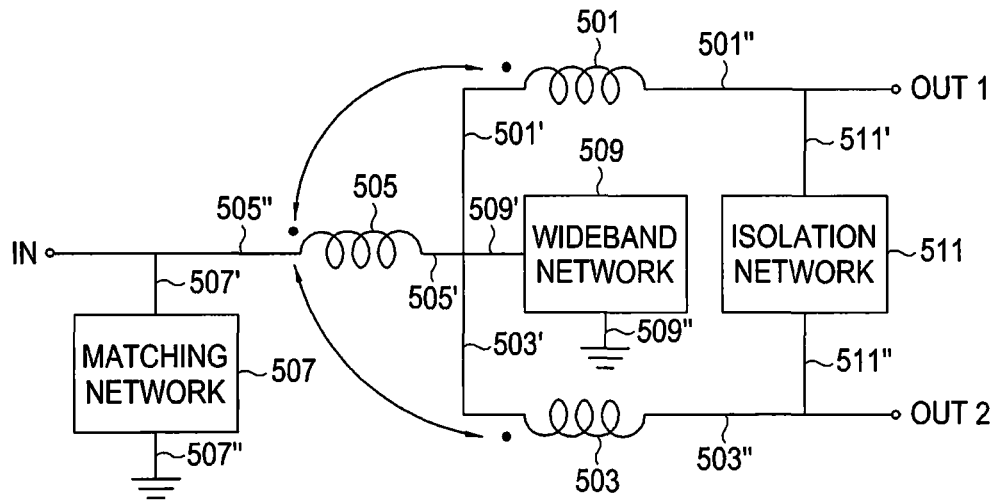
FIG. 5 illustrates a Wilkinson power combiner/divider according to an embodiment of the present disclosure.

FIG. 5 illustrates a Wilkinson power combiner/divider according to an embodiment of the present disclosure.

Referring to FIG. 5, the Wilkinson power combiner/divider may be the Wilkinson power combiner/divider of FIG. 2, adding a wideband network 509 (e.g., a broadband unit) for use in broad bands. The wideband network 509 may be connected with a first terminal 501' of the first primary inductor 501, a first terminal 503' of the second primary inductor 503, and a first terminal 505' of the sub inductor 505.

A first terminal 501' of the first primary inductor 501 may be connected with a first output port OUT1 and a first terminal 511' of the isolation network 511, and a second terminal 501" of the first primary inductor 501 may be connected with a first terminal 503' of the second primary inductor 503, a first terminal 509' of the wideband network 509, and a first terminal 505' of the sub inductor 505. The first terminal 503' of the second primary inductor 503 may be connected with a second terminal 501" of the first primary inductor 501, the first terminal 509' of the wideband network 509, and the first terminal 505' of the sub inductor 505, and a second terminal 503" of the second primary inductor 503 may be connected with a second output port OUT 2 and a second terminal 511" of the isolation network 511. The first terminal 511' of the isolation network 511 may be connected with the first terminal 501' of the first primary inductor 501, and the second terminal 511" of the isolation network 511 may be connected with the second terminal 503" of the second primary inductor 503. The first terminal 505' of the sub inductor 505 may be connected with the second terminal 501" of the first primary inductor 501, the first terminal 509' of the wideband network 509, and the first terminal 503' of the second primary inductor 503, and the second terminal 505" of the sub inductor 505 may be connected with the input port IN and a first terminal 507' of the matching network 507. The first terminal 507' of the matching network 507 may be connected with the input port IN and the second terminal 505" of the sub inductor 505, and a second terminal 507" of the matching network 507 may be connected to ground. The first terminal 509' of the wideband network 509 may be connected with the first terminal 505' of the sub inductor 505, the first terminal 503' of the second primary inductor 503, and the second terminal 501" of the first primary inductor 501, and the second terminal 509" of the wideband network 509 may be connected to ground.

Figure 6:
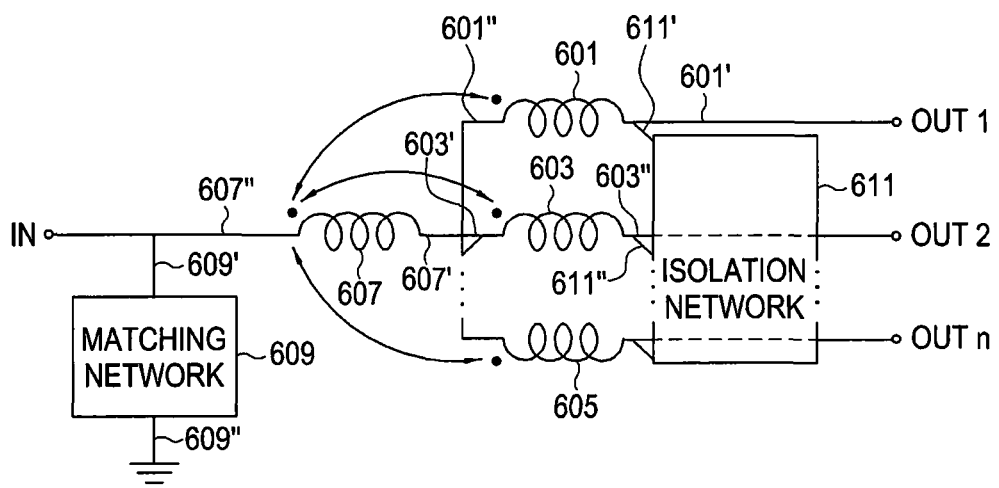
FIG. 6 illustrates a Wilkinson power combiner/divider according to an embodiment of the present disclosure.

FIG. 6 illustrates a Wilkinson power combiner/divider according to an embodiment of the present disclosure.

Although the number of output ports is limited to two in FIG. 2, the Wilkinson power combiner/divider of FIG. 6 includes multiple (n) primary inductors to support multiple (n) output ports.

Specifically, a first terminal 601' of the first primary inductor 601 may be connected with a first output port OUT1 and a first terminal 611' of the isolation network 611, and a second terminal 601" of the first primary inductor 601 may be connected with a first terminal 603' of the second primary inductor 603, a first terminal 605' of a third primary inductor 605, and a first terminal 607' of the sub inductor 607. The first terminal 603' of the second primary inductor 603 may be connected with a second terminal 601" of the first primary inductor 601, the first terminal 605' of the third primary inductor 605, and the first terminal 607' of the sub inductor 607, and a second terminal 603" of the second primary inductor 603 may be connected with a second output port OUT2 and a first terminal 611' of the isolation network 611. The first terminal 611' of the isolation network 611 may be connected with the first terminal 601' of the first primary inductor 601, and the second terminal 611" of the isolation network 611 may be connected with the second terminal 603" of the second primary inductor 603. The first terminal 607' of the sub inductor 607 may be connected with the second terminal 601" of the first primary inductor 601, the first terminal 605' of the third primary inductor 605, and the first terminal 603' of the second primary inductor 603, and the second terminal 607" of the sub inductor 607 may be connected with the input port IN and a first terminal 609' of the matching network 609. The first terminal 609' of the matching network 609 may be connected with the input port IN and the second terminal 607" of the sub inductor 607, and a second terminal 609" of the matching network 609 may be connected to ground.

Figure 7A:
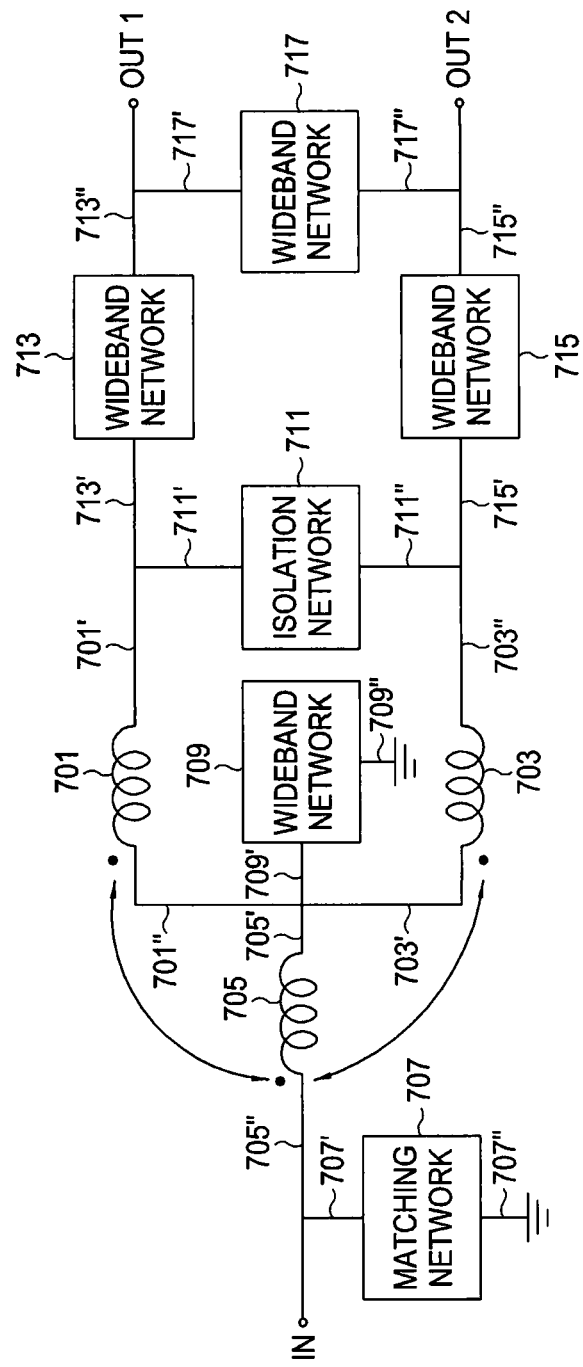
FIGS. 7A, 7B and 7C illustrate a Wilkinson power combiner/divider according to an embodiment of the present disclosure.
Figure 7B:
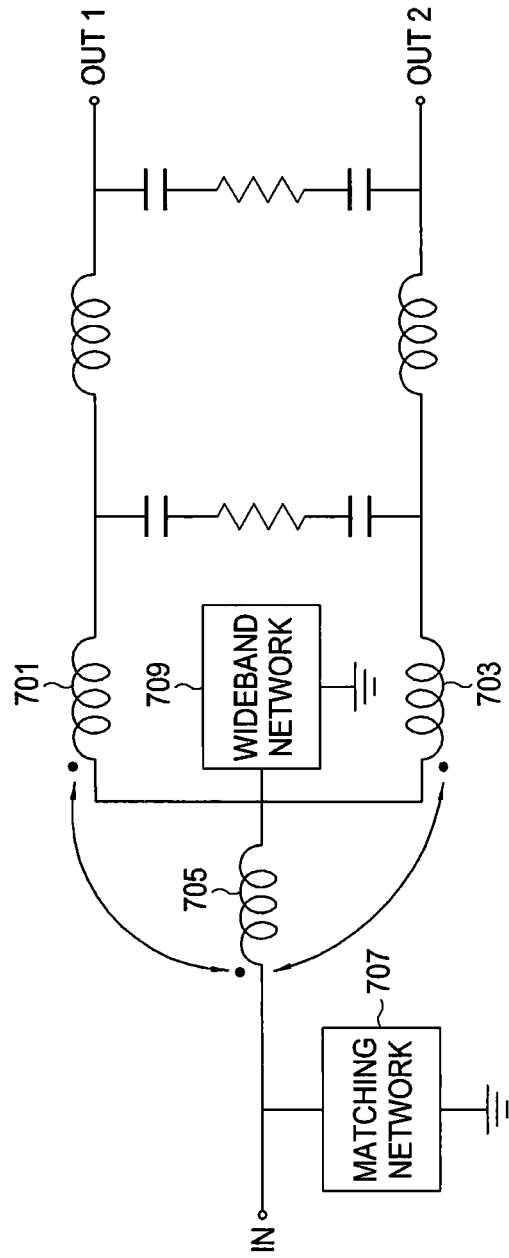
Figure 7C:
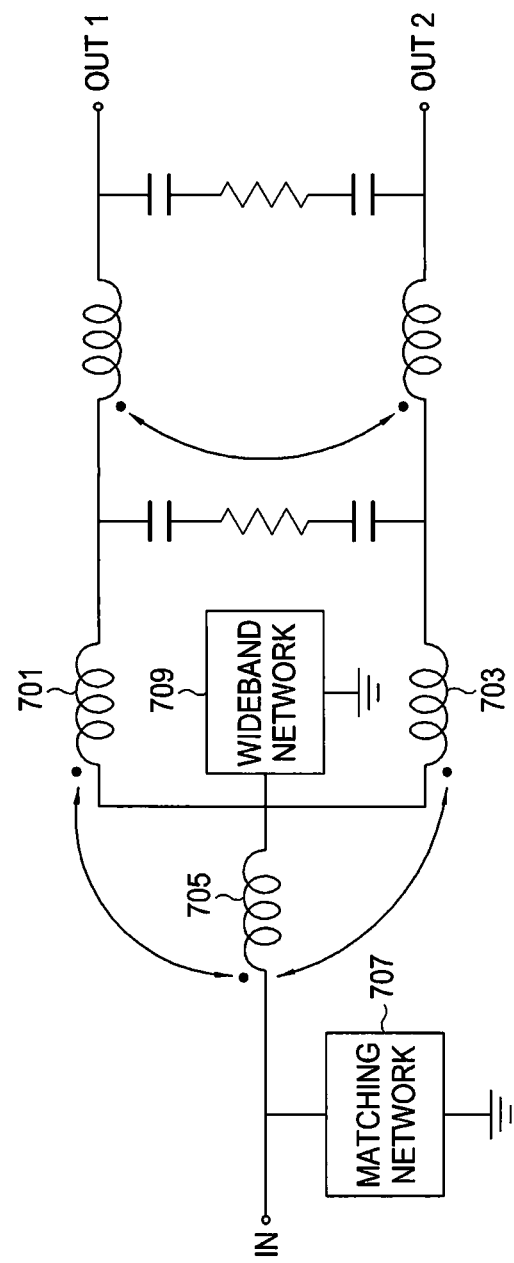

FIGS. 7A, 7B AND 7C illustrate a Wilkinson power combiner/divider according to an embodiment of the present disclosure.

Referring to FIG. 7A, the Wilkinson power combiner/divider may be the Wilkinson power combiner/divider of FIG. 2 adding wideband networks 713, 715, and 717 for use in broad bands.

Referring to FIG. 7A, a first terminal 701' of the first primary inductor 701 may be connected with a second wideband network 713 and a first terminal 711' of the isolation network 711, and a second terminal 701" of the first primary inductor 701 may be connected with a first terminal 703' of the second primary inductor 703, a first terminal 709' of the first wideband network 709, and a first terminal 705' of the sub inductor 705. The first terminal 703' of the second primary inductor 703 may be connected with a second terminal 701" of the first primary inductor 701, the first terminal 709' of the first wideband network 709, and the first terminal 705' of the sub inductor 705, and a second terminal 703" of the second primary inductor 703 may be connected with a first terminal 715' of the third wideband network 715 and a second terminal 711" of the isolation network 711. The first terminal 711' of the isolation network 711 may be connected with the first terminal 701' of the first primary inductor 701, and the second terminal 711" of the isolation network 711 may be connected with the second terminal 703" of the second primary inductor 703. The first terminal 705' of the sub inductor 705 may be connected with the second terminal 701" of the first primary inductor 701, the first terminal 709' of the first wideband network 709, and the first terminal 703' of the second primary inductor 703, and the second terminal 705" of the sub inductor 705 may be connected with the input port IN and a first terminal 707' of the matching network 707. The first terminal 707' of the matching network 707 may be connected with the input port IN and the second terminal 705" of the sub inductor 705, and a second terminal 707" of the matching network 707 may be connected to ground. The first terminal 709' of the first wideband network 709 may be connected with the first terminal 705' of the sub inductor 705, the first terminal 703' of the second primary inductor 703, and the second terminal 701" of the first primary inductor 701, and the second terminal 709" of the first wideband network 709 may be connected to ground. The first terminal 713' of the second wideband network 713 may be connected with the first terminal 701' of the first primary inductor 701 and the first terminal 711' of the isolation network 711, and the second terminal 713" of the first wideband network 713 may be connected with the first output port and a first terminal 717' of the fourth wideband network 717. The first terminal 715' of the third wideband network 715 may be connected with the second terminal 703" of the second primary inductor 703 and the second terminal 711" of the isolation network 711, and the second terminal 715" of the third wideband network 715 may be connected with the second output port and a second terminal 717" of the fourth wideband network 717. The first terminal 717' of the fourth wideband network 717 may be connected with the first terminal 713" of the second wideband network 713 and the first output port, and the second terminal 717" of the fourth wideband network 717 may be connected with the second terminal 715" of the third wideband network 715 and the second output port.

FIG. 7B illustrates an example of a Wilkinson power combiner/divider in which the second wideband network 713 and the third wideband network 715 are configured as inductors, and the isolation network 711 and the fourth wideband network 717 are configured as a capacitor and resistor.

FIG. 7C illustrates an example in which the inductors of the second wideband network 713 and the third wideband network 715 of FIG. 7B may be mutually coupled.

Figure 8A:
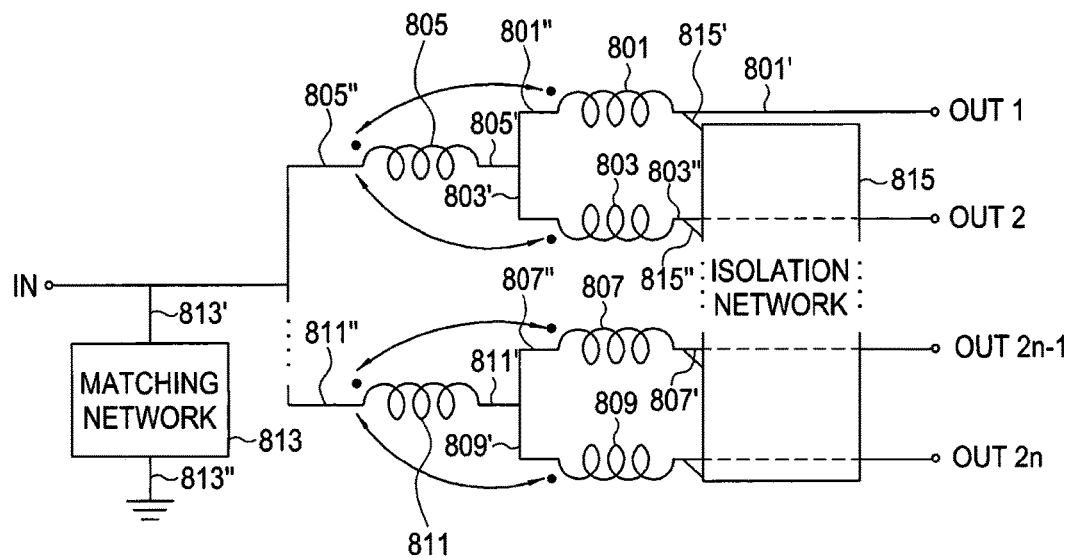
FIGS. 8A and 8B illustrate a Wilkinson power combiner/divider according to an embodiment of the present disclosure.
Figure 8B:
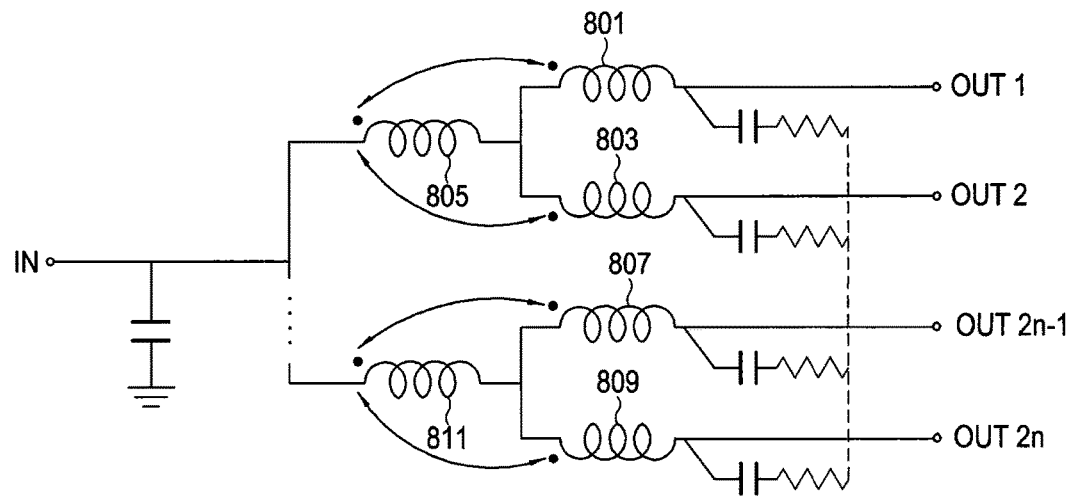

FIGS. 8A and 8B illustrate a Wilkinson power combiner/divider according to an embodiment of the present disclosure, supporting multiple output ports in a different manner from that shown in FIG. 6. In other words, FIGS. 8A and 8B illustrate examples in which Wilkinson power combiner/dividers as shown in FIG. 2 are connected in parallel.

Referring to FIG. 8A, a first terminal 801' of the first primary inductor 801 may be connected with a first output port OUT 1 and a first terminal 815' of the isolation network 815, and a second terminal 801" of the first primary inductor 801 may be connected with a first terminal 803' of the second primary inductor 803 and a first terminal 805' of the first sub inductor 805. The first terminal 803' of the second primary inductor 803 may be connected with a second terminal 801" of the first primary inductor 801 and the first terminal 805' of the first sub inductor 805, and a second terminal 803" of the second primary inductor 803 may be connected with a second output port OUT 2 and a second terminal 815" of the isolation network 815. The first terminal 815' of the isolation network 815 may be connected with the first terminal 801' of the first primary inductor 801, and the second terminal 815" of the isolation network 815 may be connected with the second terminal 803" of the second primary inductor 803. The first terminal 805' of the first sub inductor 805 may be connected with the second terminal 801" of the first primary inductor 801 and the first terminal 803' of the second primary inductor 803, and the second terminal 805" of the first sub inductor 805 may be connected with the input port IN, a second terminal 811" of the second sub inductor 811, and a first terminal 813' of the matching network 813. The first terminal 813' of the matching network 813 may be connected with the input port IN, the second terminal 805" of the first sub inductor 805, and the second terminal 811" of the second sub inductor 811, and a second terminal 813" of the matching network 813 may be connected to ground. A first terminal 807' of the third primary inductor 807 may be connected with a 2n-1th output port OUT 2n-1 and a first terminal 815' of the isolation network 815, and a second terminal 807" of the third primary inductor 807 may be connected with a first terminal 809' of the fourth primary inductor 809 and a first terminal 811' of the second sub inductor 811. The first terminal 809' of the fourth primary inductor 809 may be connected with a second terminal 807" of the third primary inductor 807 and the first terminal 807' of the third sub inductor 807, and a second terminal 809" of the fourth primary inductor 809 may be connected with a 2nth output port OUT 2n and a second terminal 815' of the isolation network 815. The first terminal 811' of the second sub inductor 811 may be connected with the second terminal 807" of the third primary inductor 807 and the first terminal 809' of the fourth primary inductor 809, and the second terminal 811" of the second sub inductor 811 may be connected with the input port IN, the second terminal 805" of the first sub inductor 805, and a first terminal 813' of the matching network 813.

FIG. 8B illustrates an example of a Wilkinson power combiner/divider in which the matching network 813 is configured as a capacitor, and the isolation network 815 is configured as multiple capacitors and resistors.

Figure 9A:
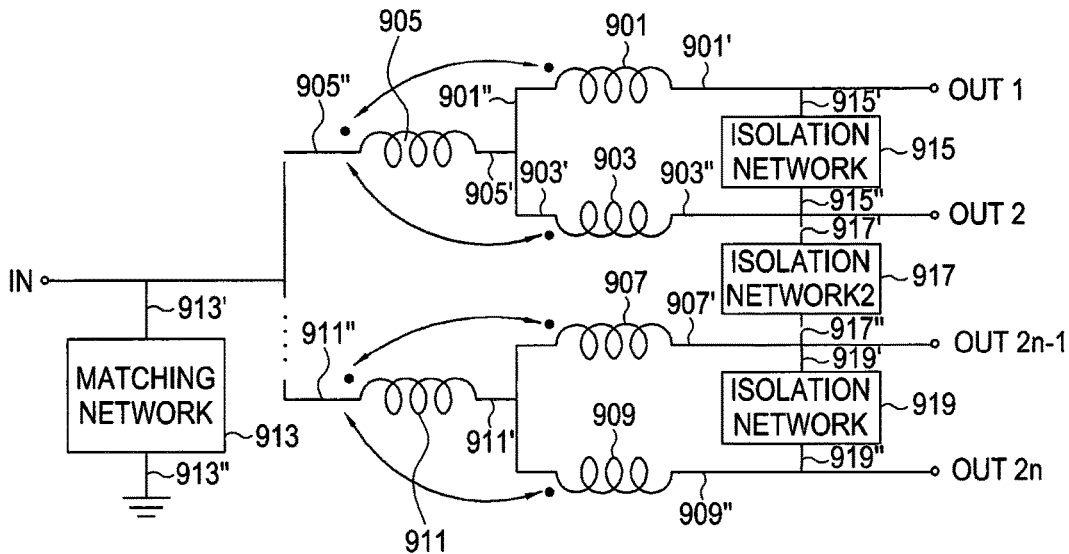
FIGS. 9A and 9B illustrate a Wilkinson power combiner/divider according to an embodiment of the present disclosure.
Figure 9B:
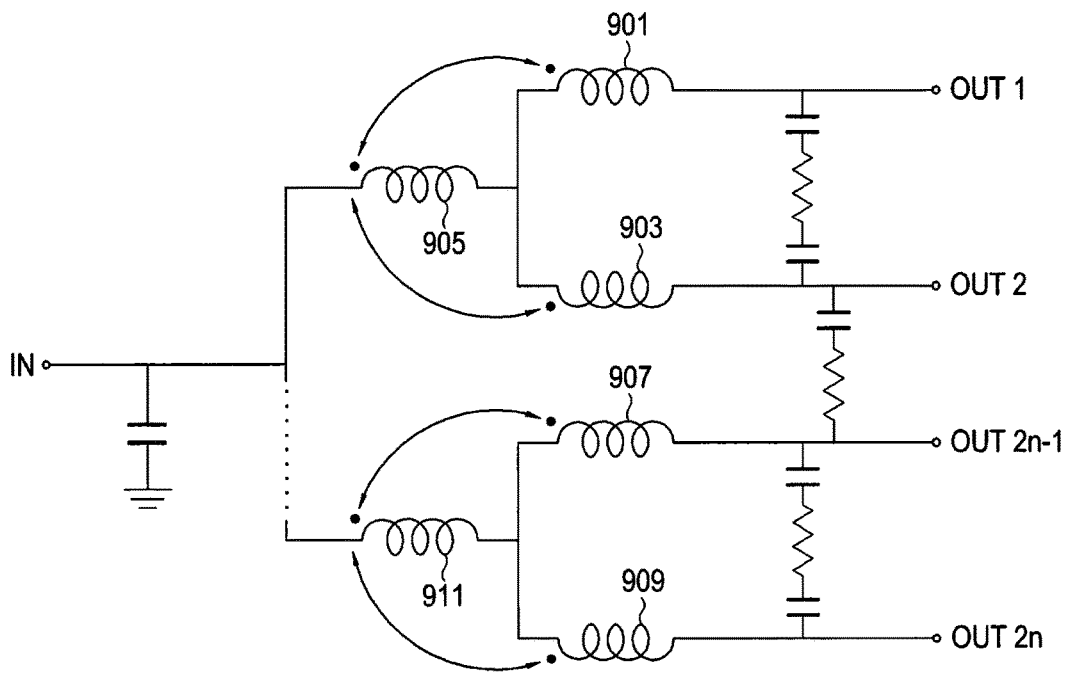

FIGS. 9A and 9B illustrate a Wilkinson power combiner/divider according to an embodiment of the present disclosure.

In the Wilkinson power combiner/divider of FIGS. 9A and 9B, although similar to that shown in FIGS. 8A and 8B, separate isolation networks, respectively, are implemented on line paths.

Referring to FIG. 9A, a first terminal 901' of the first primary inductor 901 may be connected with a first output port OUT 1 and a first terminal 915' of a first isolation network 915, and a second terminal 901" of the first primary inductor 901 may be connected with a first terminal 903' of the second primary inductor 903 and a first terminal 905' of the first sub inductor 905. The first terminal 903' of the second primary inductor 903 may be connected with a second terminal 901" of the first primary inductor 901 and the first terminal 905' of the first sub inductor 905, and a second terminal 903" of the second primary inductor 903 may be connected with a second output port OUT 2 and a second terminal 915" of the first isolation network 915. The first terminal 915' of the first isolation network 915 may be connected with the first terminal 901' of the first primary inductor 901, and the second terminal 915" of the first isolation network 915 may be connected with the second terminal 903" of the second primary inductor 903. The first terminal 905' of the first sub inductor 905 may be connected with the second terminal 901" of the first primary inductor 901 and the first terminal 903' of the second primary inductor 903, and the second terminal 905" of the first sub inductor 905 may be connected with the input port IN, a second terminal 911" of the second sub inductor 911, and a first terminal 913' of the matching network 913. The first terminal 913' of the matching network 913 may be connected with the input port IN, the second terminal 905" of the first sub inductor 905, and the second terminal 911" of the second sub inductor 911, and a second terminal 913" of the matching network 913 may be connected to ground. A first terminal 907' of the third primary inductor 907 may be connected with a 2n-1th output port OUT 2n-1 and a first terminal 919' of the third isolation network 919, and a second terminal 907" of the third primary inductor 907 may be connected with a first terminal 909' of the fourth primary inductor 909 and a first terminal 911' of the second sub inductor 911. The first terminal 909' of the fourth primary inductor 909 may be connected with a second terminal 907" of the third primary inductor 907 and the first terminal 907' of the third sub inductor 907, and a second terminal 909" of the fourth primary inductor 909 may be connected with a 2nth output port OUT 2n and a second terminal 919" of the third isolation network 919. The first terminal 911' of the second sub inductor 911 may be connected with the second terminal 907" of the third primary inductor 907 and the first terminal 909' of the fourth primary inductor 909, and the second terminal 911" of the second sub inductor 911 may be connected with the input port IN, the second terminal 905" of the first sub inductor 905, and a first terminal 913' of the matching network 913. The first terminal 919' of the third isolation network 919 may be connected with the first terminal 907' of the third primary inductor 907, and the second terminal 919" of the third isolation network 919 may be connected with the second terminal 909" of the fourth primary inductor 909. The first terminal 917' of the second isolation network 917 may be connected with the second terminal 903" of the second primary inductor 903, and the second terminal 917" of the second isolation network 917 may be connected with the first terminal 907' of the third primary inductor 907.

FIG. 9B illustrates an example of a Wilkinson power combiner/divider in which the matching network 913 is configured as a capacitor, and the isolation networks 915, 917, and 919 are configured as capacitors and resistors.

The embodiments herein are provided merely for better understanding of the present disclosure, and the present disclosure is limited thereto. In other words, it is apparent to one of ordinary skill in the art that various changes may be made thereto without departing from the scope of the present disclosure. While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. A power divider circuit using a mutual inductance, comprising:
    a first primary inducing element having a first terminal connected with a first output port and a second terminal connected with a second primary inducing element;
    the second primary inducing element having a first terminal connected with a second output port and a second terminal connected with the first primary inducing element and magnetically and mutually coupled with the first primary inducing element;
    a first sub inducing element having a first terminal connected with an input port and a second terminal connected with the second terminal of the first primary inducing element and the second terminal of the second primary inducing element; and
    an isolation network connected between the first output port and the second output port, wherein the first sub inducing element is magnetically and mutually coupled with each of the first primary inducing element and the second primary inducing element.

2. The power divider circuit of claim 1, further comprising an input matching network having a first terminal connected with the input port and the first terminal of the first sub inducing element and a second terminal connected to ground.

3. The power divider circuit of claim 1, further comprising a wideband network having a first terminal connected with the second terminal of the first primary inducing element and the second terminal of the second primary inducing element and a second terminal connected to ground.

4. The power divider circuit of claim 1, wherein the first primary inducing element, the second primary inducing element, and the first sub inducing element are an inductor or a transmission line.

5. The power divider circuit of claim 1, further comprising a third primary inducing element having a first terminal connected with a third output port and a second terminal connected with the second terminal of the first primary inducing element and the second terminal of the second primary inducing element and magnetically and mutually coupled with the second primary inducing element, wherein the first sub inducing element is magnetically and mutually coupled with the third primary inducing element.

6. The power divider circuit of claim 1, further comprising:
a third primary inducing element having a first terminal connected with a third output port and a second terminal connected with a fourth primary inducing element;
the fourth primary inducing element having a first terminal connected with a fourth output port and a second terminal connected with the third primary inducing element and magnetically and mutually coupled with the third primary inducing element; and
a second sub inducing element having a first terminal connected with an input port and a second terminal connected with the second terminal of the third primary inducing element and the second terminal of the fourth primary inducing element, wherein the second sub inducing element is magnetically and mutually coupled with each of the third primary inducing element and the fourth primary inducing element.

7. The power divider circuit of claim 6, further comprising another isolation network having a first terminal connected with the first terminal of the second primary inducing element and a second terminal connected with the first terminal of the third primary inducing element.

8. The power divider circuit of claim 1, further comprising a matching network having a first terminal connected with the input port and the first terminal of the first sub inducing element and a second terminal connected to ground.

9. The power divider circuit of claim 8, wherein the matching network is configured as a capacitor.

10. The power divider circuit of claim 1, wherein the isolation network is configured as a capacitor and a resistor.

* * * * *